(12) United States Patent
Lin

(10) Patent No.: US 6,333,852 B1
(45) Date of Patent: Dec. 25, 2001

(54) CPU HEAT DISSIPATION DEVICE WITH SPECIAL FINS

(76) Inventor: Liken Lin, No. 35, Sec. 4, Chung Yang Rd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 09/689,619

(22) Filed: Oct. 13, 2000

(51) Int. Cl.[7] ...................................................... H05K 7/20
(52) U.S. Cl. ........................ 361/697; 165/80.3; 165/121; 165/185; 361/704; 361/715; 454/184
(58) Field of Search ..................... 165/80.2, 80.3, 165/121–122, 185; 257/722; 361/687, 690, 694–697, 715; 415/177–178; 454/184

(56) References Cited

U.S. PATENT DOCUMENTS

| | | | |
|---|---|---|---|
| 5,727,624 | * 3/1998 | Ko et al. | 165/121 |
| 5,884,691 | * 3/1999 | Batchelder | 165/80.3 |
| 5,940,269 | * 8/1999 | Ko et al. | 361/697 |
| 6,170,563 | * 1/2001 | Hsieh | 361/697 |

* cited by examiner

*Primary Examiner*—Gregory Thompson
(74) *Attorney, Agent, or Firm*—Jacobson Holman, PLLC

(57) ABSTRACT

The CPU heat dissipation device with special fins includes a fan sink mounted above a CPU with a plurality of fins, a fan and a cover thereof. A slot is mounted on the fan sink while a socket for mounting a fan is disposed on one side thereof. The cover is covered on the top of the fan sink. The characteristic of the device is in special fins which have different designs such as elliptic shaped, strip-shaped, foliar shape, and crescent shape. In accordance with the structure mentioned above, the velocity of airflow is increased by the high-pressure channels composed of various kinds of fins. Thus the heat dispersion rate can be improved.

6 Claims, 3 Drawing Sheets

CPU HEAT DISSIPATION DEVICE WITH SPECIAL FINS

BACKGROUND OF THE INVENTION

1. Field of the Invention

The present invention relates to a CPU (central processing unit) heat dissipation device with special fins, especially to a CPU heat dissipation device with elliptic fins, strip-shaped fins, and foliar fins and crescent fins that forms a plurality of high-pressure channels in order to increase velocity of the air current.

The conventional location of the CPU in computers is far from air outlets thus even with fans, the efficiency of heat dissipation is not sufficient due to the long pathway of hot airflow. And the temperature of CPU under operation can't be kept inside the safe range. Refer to FIG. 3, the conventional heat dissipation device for CPU includes a CPU (a) and a fan sink (b) mounted thereabove. The fan sink (b) includes a slot (b1) thereon and a plurality of longitudinal fins (b2) fixed inside the slot (b1). A socket (b3) for accommodating a fan (c) is arranged on one side of the slot (b1). Therefore, the heat generating from CPU (a) is absorbed by the fan sink (b) and is dissipated by fan (c).

However, due to the longitudinal shape of fins (b2) on the heat sink (b), airflow drawn by the fan (c) flows through the slot (b1) in the same velocity so that the heat can't be brought out effectively and the efficiency of heat dispersion is not well.

Furthermore, three lateral walls of the socket (b3) in the fan sink (b) for accommodating a fan (c) is closed without any outlets. Thus when the fan (c) is running for inducing fresh air, the vortex of air current is produced that stays in the socket (b3) so that the wind pressure and resistance are increased. Therefore, the current can't flow fluently and the efficiency of heat dissipation is decreased.

SUMMARY OF THE INVENTION

It is therefore a primary object of the present invention to provide a CPU heat dissipation device with different kind of fins such as elliptic fins, strip-shaped, foliar fins, crescent fins. These various fins form high pressure channels for increasing the velocity air current and for enhancing the efficiency of heat dissipation.

In order to achieve the object mentioned above, the CPU heat dissipation device with special fins includes a fan sink mounted above a CPU with a plurality of fins, a fan and a cover thereof. A slot is mounted on the fan sink while a socket for mounting a fan is disposed on one side thereof. The cover is covered on the top of the fan sink. The characteristic of the device is in special fins which have different designs such as elliptic shaped, strip-shaped, foliar shape, and crescent shape. In accordance with the structure mentioned above, the velocity of airflow is increased by the high-pressure channels composed of various kinds of fins. Thus the heat dispersion rate can be improved.

BRIEF DESCRIPTION OF THE DRAWINGS

The accomplishment of the above-mentioned object of the present invention will become apparent from the following description and its accompanying drawings which disclose illustrative an embodiment of the present invention, and are as follows.

DETAILED DESCRIPTION OF THE PREFERRED EMBODIMENT

Figure 1:
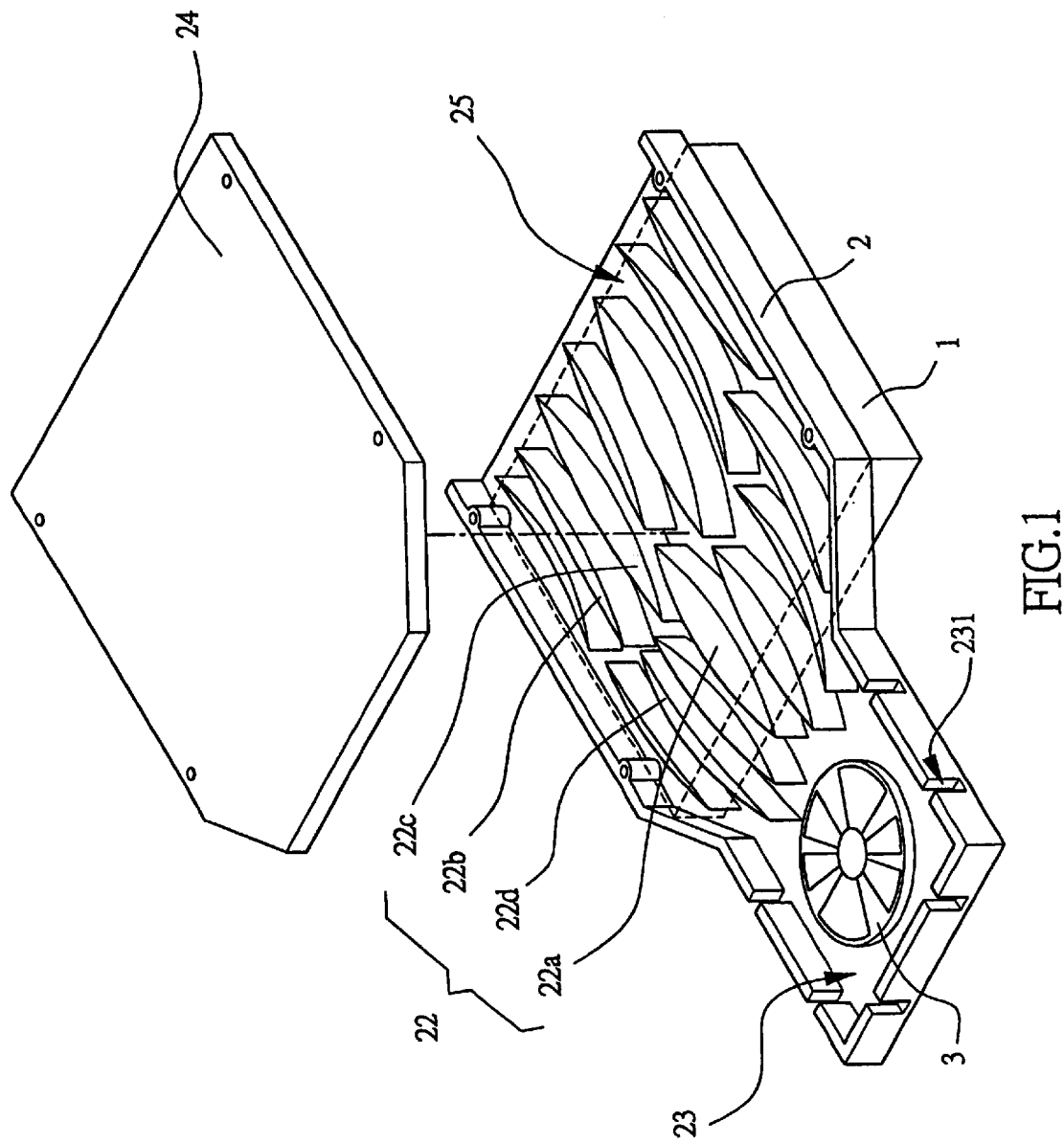
FIG. 1 is a perspective assembled view of the present invention.
Figure 2:
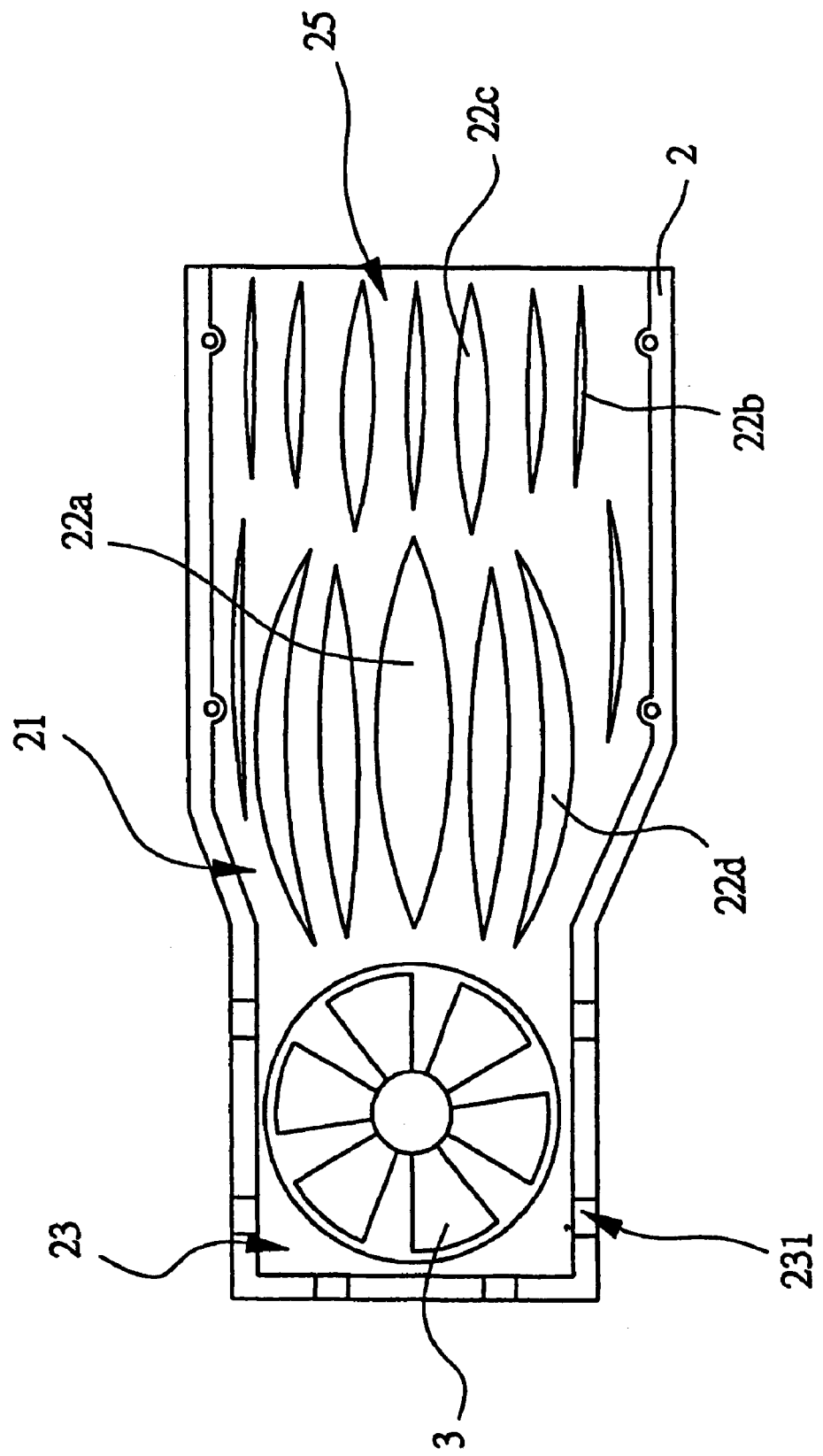
FIG. 2 is a top view of the present invention.
Figure 3:
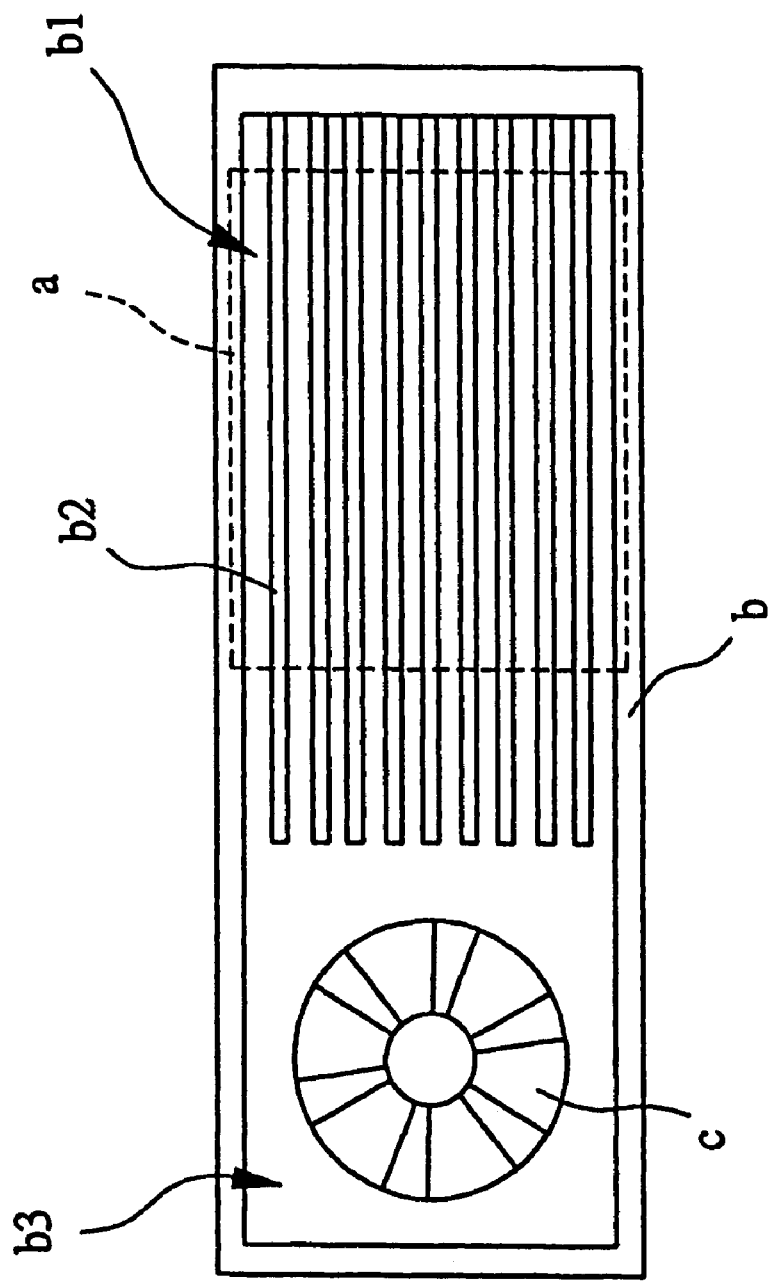
FIG. 3 is a top view of the prior art in accordance with the present invention.

Refer to FIG. 1. & FIG. 2, the present invention includes a fan sink 2 on a CPU 1 with a slot 21 thereof. A plurality of fins 22 are mounted on the slot 21 inside the fan sink 2. A socket 23 for mounting a fan 3 is secured on one end of the slot 21 while a cover 26 is disposed on the top of the fan sink 2. Thus the heat generated from the CPU 1 is absorbs by the fan sink 2 and turned out by the operation of the fan 3. The improvement of the present invention is in the fins 22. The fins 22 in the fan sink 2 contains elliptic fins 22a, strip-shaped fins 22b, foliar fins 22c, and crescent fins 22d. These different fins form high-pressure channels by which the velocity of airflow is increased in order to bring out heat more quickly.

In accordance with the structure mentioned above, a plurality of high-pressure channels 25 are formed by elliptic fins 22a, strip-shaped fins 22b, foliar fins 22c, and crescent-shaped fins 22d. When the fan 3 induces the air current into the channels 25, the airflow is pressed by the high-pressure channels 25 so as to increase the velocity of airflow and the heat dispersion efficiency is improved.

In addition, the two ends of the elliptic fins 22a are sharp while the width of the middle part thereof is about 10 mm. The two ends of the strip-shaped fins 22b are pointed while the width of the middle part thereof is about 1 mm. The width of middle part of the foliar fins is 5 mm. The two ends of the crescent-shaped fins 22d are cuspidal and the width of the middle part thereof is 3.5 mm. This is the detailed description of an embodiment of the present invention.

Moreover, a plurality of vents 231 are arranged on the lateral sides of the socket 23 for mounting the fan 3 on the fan sink 2 for air ventilation so as to avoid the unescaped turbulent airflow in the socket 23 that causes the increasing of wind pressure and resistance as well as stationary airflow, hence the heat dissipation efficiency is increased.

Many changes and modifications in the above-described embodiments of the invention can, of course, be carried out without departing from the scope thereof. Accordingly, to promote the progress in science and the useful arts, the invention is disclosed and is intended to be limited only by the scope of the appended claim.

What is claimed is:

1. A CPU heat dissipation device with special fins comprising a fan sink being mounted above a CPU with a slot thereof, a plurality of fins being arranged inside said fan sink, a socket for mounting a fan being disposed on one side of said fan sink, a cover located on the top of said fan sink, wherein the heat generating from said CPU is absorbed by said fan sink and is dispersed by said fan; the present invention is characterized in that said fins on said fan sink includes elliptic fins, strip-shaped fins, and foliar fins and crescent fins that forms a plurality of high-pressure channels in order to increase the velocity of airflow.

2. A CPU heat dissipation device with special fins as claimed in claim 1, wherein a plurality of vents are arranged on the lateral sides of said socket which is used for mounting said fan on said fan sink.

3. A CPU heat dissipation device with special fins as claimed in claim 1, wherein the two ends of said elliptic fins are sharp while the width of the middle part thereof is about 10 mm.

4. A CPU heat dissipation device with special fins as claimed in claim 1, wherein the two ends of said strip-shaped fins are pointed while the width of the middle part thereof is about 1 mm.

5. A CPU heat dissipation device with special fins as claimed in claim 1, wherein the two ends of said foliar fins are sharp while the width of the middle part thereof is about 5 mm.

6. A CPU heat dissipation device with special fins as claimed in claim 1, wherein the two ends of said crescent-shaped fins are cuspidal and the width of the middle part thereof is 3.5 mm.

\* \* \* \* \*